United States Patent
Fuller

(10) Patent No.: US 7,213,640 B2
(45) Date of Patent: May 8, 2007

(54) HEAT EXCHANGER ASSEMBLY HAVING FITTING SECURED THERETO AND METHOD OF SECURING THE SAME

(75) Inventor: Christopher Alfred Fuller, Buffalo, NY (US)

(73) Assignee: Delphi Technologies, Inc., Troy, MI (US)

( * ) Notice: Subject to any disclaimer, the term of this patent is extended or adjusted under 35 U.S.C. 154(b) by 63 days.

(21) Appl. No.: 11/101,275

(22) Filed: Apr. 7, 2005

(65) Prior Publication Data

US 2006/0225873 A1 Oct. 12, 2006

(51) Int. Cl.
*F28D 7/00* (2006.01)

(52) U.S. Cl. ............................. 165/178; 165/157

(58) Field of Classification Search .............. 165/157, 165/158, 173, 178; 285/140.1, 189, 141.1, 285/382.4
See application file for complete search history.

(56) References Cited

U.S. PATENT DOCUMENTS

| | | | |
|---|---|---|---|
| 1,647,447 A | | 11/1927 | Hartnett |
| 2,269,895 A | * | 1/1942 | Foster et al. ............. 285/141.1 |
| 2,566,502 A | * | 9/1951 | Smith ........................ 285/189 |
| 3,754,731 A | | 8/1973 | Mackal et al. |
| 4,528,733 A | * | 7/1985 | Lord ......................... 285/381.2 |
| 4,858,686 A | | 8/1989 | Calleson |
| 4,867,486 A | | 9/1989 | Fukata et al. |
| 5,151,157 A | * | 9/1992 | le Gauyer ................... 165/140 |
| 5,407,004 A | | 4/1995 | DeRisi et al. |
| 5,564,756 A | * | 10/1996 | Hamilton ..................... 285/222 |
| 5,785,119 A | * | 7/1998 | Watanabe et al. ........... 165/178 |
| 6,138,747 A | | 10/2000 | Kroger et al. |
| 6,178,636 B1 | | 1/2001 | Kroger et al. |
| 6,328,073 B1 | | 12/2001 | Slais |
| 6,347,663 B1 | * | 2/2002 | Hunzinger et al. ......... 165/178 |
| 6,572,153 B2 | | 6/2003 | Tatsuta et al. |
| 6,860,324 B2 | * | 3/2005 | Kato et al. .................. 165/178 |
| 2002/0041097 A1 | * | 4/2002 | Gagnon et al. ............. 285/189 |
| 2003/0197370 A1 | | 10/2003 | Tatsuta et al. |

\* cited by examiner

*Primary Examiner*—Teresa J. Walberg
(74) *Attorney, Agent, or Firm*—Patrick M. Griffin

(57) ABSTRACT

The subject invention provides a heat exchanger assembly including a tank having a wall defining an aperture with a fitting secured thereto and a method of securing the fitting thereto. The fitting has a first end with an outer perimeter disposed exteriorly thereof and smaller than the aperture for inserting the first end of the fitting into the aperture. The fitting also has an internal tunnel extending along an axis thereto from the first end. A step of material is disposed in the tunnel at the first end, which is at least in part, radially and longitudinally displaced relative to the axis into contact with the wall to prevent rotational movement of the fitting in the aperture.

15 Claims, 4 Drawing Sheets

HEAT EXCHANGER ASSEMBLY HAVING FITTING SECURED THERETO AND METHOD OF SECURING THE SAME

TECHNICAL FIELD

The subject invention relates to a heat exchanger assembly, and more specifically, a liquid cooling unit having a fitting secured thereto and a method of securing the same.

BACKGROUND OF THE INVENTION

Various methods are known for attaching fittings to components of heat exchanger assemblies. Generally, the component includes a wall defining an aperture and the fitting is positioned in the aperture. Next, from inside of the tank, a tool is used to expand a portion of the fitting to have an interference fit with the wall. One disadvantage of such a method is that the fitting must be attached to the tank from inside the tank. The tank is typically enclosed such that the fitting must be secured to the tank prior to the tank being sealed. In other words, the fitting is connected before the manufacturing of the tank is complete. The fitting may become dislodged or loosened as the manufacturing of the tank is completed or the fitting may prevent the tank from being assembled. One such assembly is illustrated in U.S. Pat. No. 5,785,119 to Watanabe et al. The fitting is inserted into the tank and then the tool bends the material into engagement with the wall. Another such assembly is shown in U.S. Pat. No. 4,867,486 to Fukata et al. Again, the fitting is secured from inside the tank and therefore the fitting must be attached prior to completing the tank.

Still another method and assembly is disclosed in U.S. Pat. Nos. 6,138,747 and 6,178,636, both to Kroger et al. The '747 patent and the '636 patent each disclose inserting a mandrel head into a fitting from outside the heat exchanger to secure the fitting thereto. The mandrel head includes a spherical tip having a diameter greater than the tube to cause an interference fit to swage the tube into baffles. The swaging of the tubes limits movement of the tubes and does not prevent rotational movement of the tubes. One disadvantage of these swaging methods is that the tools are generally expandable and flexible resulting in the tools being very fragile. Therefore, additional precautions must be in place for handling the tools to protect the tools from breaking.

The related art methods and assemblies are characterized by one or more inadequacies. Specifically, the fitting is secured to the tank from inside the tank and the fitting may become loosened during the manufacturing of the tank and prevent the tank from being assembled. Further, smaller tanks or apertures of the tank that are obscured may not have access to secure the fitting from the inside. Additionally, the related art does not provide methods or assemblies to prevent rotational movement or add rotational strength of the fitting once connected to the tank. When connectors, such as tubes are connected to the fitting, the connectors are generally connected with a rotational force. This rotational force results in the fittings of the related art becoming disconnected from the tank or loosened such that fluid may leak therefrom. Accordingly, it would be advantageous to provide an assembly and method that overcomes these inadequacies.

SUMMARY OF THE INVENTION AND ADVANTAGES

The subject invention provides a heat exchanger assembly including a tank having a wall defining an aperture with a fitting secured thereto and a method of securing the fitting thereto. The fitting has a first end with an outer perimeter disposed exteriorly thereof and smaller than the aperture for inserting the first end of the fitting into the aperture. The fitting also has an internal tunnel extending along an axis thereto from the first end. A step of material is disposed in the tunnel at the first end, which is at least in part, radially and longitudinally displaced relative to the axis into contact with the wall to prevent rotational movement of the fitting in the aperture.

The method of securing the fitting includes the steps of disposing the first end of the fitting into the aperture and inserting a tool within the fitting from a direction outside of the tank. Inserting the tool results in radially and longitudinally displacing at least a part of the step of material relative to the axis into contact with the wall. The displaced part of the step secures the fitting into the aperture and prevents rotational movement of the fitting.

The subject invention overcomes the inadequacies that characterize the related art assemblies. Specifically, the radial and longitudinal displacement of the step of material prevents rotational movement of the fitting when connectors are attached thereto. Further, the subject invention has increased resistance to other stresses as a result of the step of material being radially and longitudinally displaced. Certain uses of the fitting, such as a threaded fitting, must have strength to withstand sufficient shear forces. The subject invention provides sufficient rotational strength to accommodate such shear forces. Additionally, the method, according to the subject invention, allows the fittings to be secured to tank from outside of the tank. Therefore, the fitting can be secured to the tank after the tank has been manufactured which reduces the likelihood that the fitting may become dislodged or loosed during the manufacturing of the tank.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Figure 1:
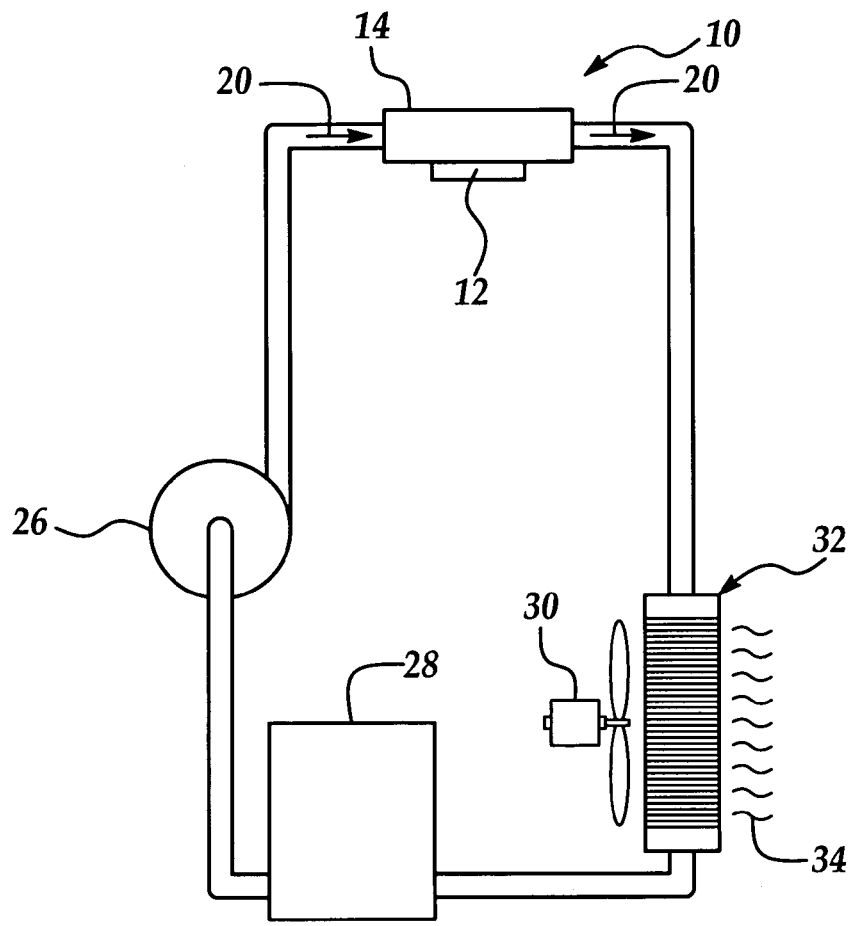
FIG. 1 a schematic view of a heat exchanger assembly for cooling a device.

Referring to the Figures, wherein like numerals indicate corresponding parts throughout the several views, a heat exchanger assembly is shown generally at 10 in FIG. 1. The heat exchanger assembly 10 is preferably a liquid cooling unit (LCU) for cooling a device 12. The subject invention finds additional uses in other industries, such as, automotive, medical, heating, ventilation, and air cooling, commercial, and the like. For example, the subject invention may be employed with any assembly that conveys fluid through an enclosed volume. The subject invention is particularly useful with electronic devices such as, but not limited to, computer chips, telecommunication chips, microprocessor assemblies, and the like. These electronic devices are used in various systems (not shown), such as computer systems, telecommunication systems, and the like.

The heat exchanger assembly 10 includes a tank 14 having a wall 16 defining an aperture 18. As appreciated by those skilled in the art, the tank 14 holds a working fluid 20 for absorbing heat from the device 12. Therefore, the wall 16 has an inner surface 22 exposed to an inner fluid, i.e., the working fluid 20, and an outer surface 24 exposed to air. The devices 12 are preferably flexibly attached to one of the outer surfaces 24 of tank 14; however, one skilled in the art may connect the electronic devices 12 by other methods without deviating from the subject invention. As the device 12 generates heat, the tank 14 absorbs the heat and communicates the heat to the working fluid 20 thereby cooling the device 12.

The assembly further comprises a working fluid moving device 26, a working fluid storage tank 28 to store excess working fluid 20, a cooling fluid moving device 30 operating in conjunction with a heat exchanger 32 to dissipate heat from the working fluid 20 to a cooling fluid 34. The working fluid 20 is propelled through the assembly by the working fluid moving device 26. One illustrative example of the working fluid moving device 26 is a pump. The pump may be any type capable of supplying the working fluid 20 at a rate sufficient to dissipate the heat from the device 12.

The cooling fluid 34 is propelled through the heat exchanger 32 of the assembly by the cooling fluid moving device 30. One example of the cooling fluid moving device 30 is, but not limited to, an axial fan. The fan can be any type, a pull or push type, capable of supplying the cooling fluid 34 to the heat exchanger 32 at a rate sufficient to dissipate the required amount of heat from the heat-generating element.

Figure 2:
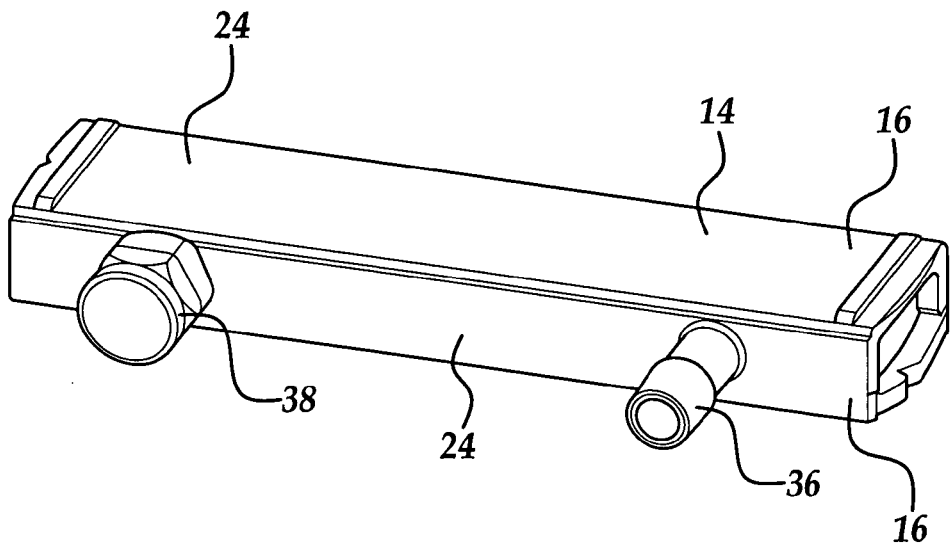
FIG. 2 is a perspective view of a tank for use with the heat exchanger assembly.
Figure 3:
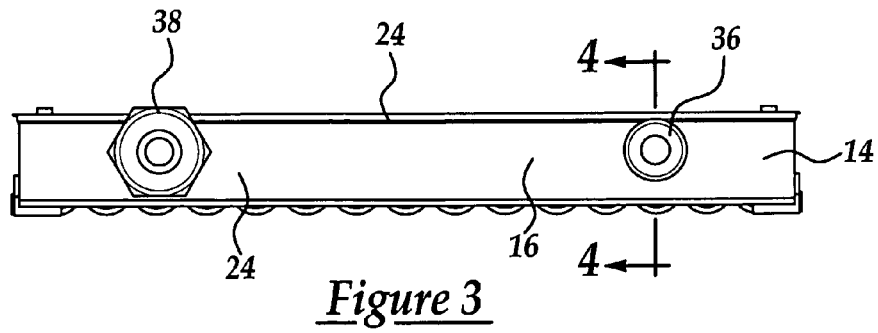
FIG. 3 is a side of view of the tank illustrated in FIG. 2.

Referring to FIG. 2, a close-up perspective view of the tank 14 is illustrated. Although the subject invention is illustrated as relating to the tank 14 having the device 12 attached thereto, those skilled in the art will appreciate that the subject invention may employed with the heat exchanger 32 or the working fluid storage tank 28 or similar tanks in other systems. FIG. 3 is side view of the tank 14 illustrated in FIG. 2. The subject invention includes a fitting 36 and a charging port 38 attached to the tank 14. The charging port 38, as understood by those skilled in the art, is used to charge the tank 14 with the working fluid 20. The fitting 36 connects tubes (not shown), such as drainage tubes, inlet or outlet tubes, and the like, to the tank 14. Yet still, the fitting 36 may be used in conjunction with a bracket (not shown) to connect adjacent tanks together, such that the fitting 36 connects to the tank 14 and the bracket then secure the fitting 14 to the other tank.

Figure 4:
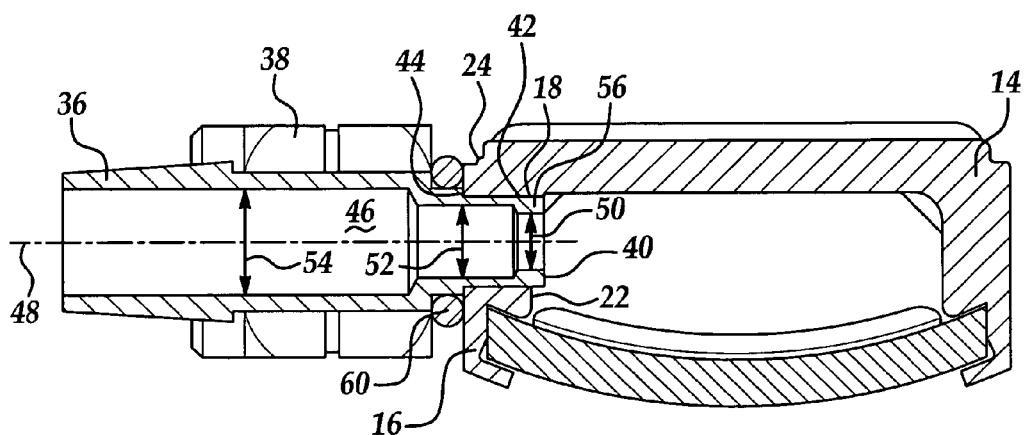
FIG. 4 is a cross-sectional view taken along line 4—4 shown in FIG. 3.

A cross-sectional view of the fitting 36 taken along line 4—4 of FIG. 3 is illustrated in FIG. 4. The fitting 36 has a first end 40 with an outer perimeter 42 disposed exteriorly thereof. The outer perimeter 42 at the first end 40 is smaller than the aperture 18 for inserting into the aperture 18. The fitting 36 may also include larger and stepped outer perimeters longitudinally spaced from the first end 40 to secure the tubes to the fitting 36. The fitting 36 may also include a flange 44 extending about the outer perimeter 42 for abutting the outer surface 24 of the wall 16. It is to be understood that the flange 44 may not necessarily directly contact the outer surface 24, but may be secured thereto as will be described further below. In another embodiment, if the fitting 36 has the stepped larger outer perimeters to engage the outer surface 24, then the flange 44 may be eliminated.

The fitting 36 has an internal tunnel 46 extending along an axis 48 thereto from the first end 40. The internal tunnel 46 may be used to convey the working fluid 20 into or out of the tank 14. The fitting 36 is illustrated as being cylindrical; however, other geometrical shapes, such as oval, rectangular, or the like may be utilized with the subject invention. The fitting 36 has at least a first inner diameter 50 at the first end 40 and a second inner diameter 52 spaced longitudinally from the first end 40. Preferably, the first inner diameter 50 is smaller than the second inner diameter 52. As illustrated in FIG. 4, the fitting 36 has a third inner diameter 54 that is larger than the second inner diameter 52 spaced further from the first end 40.

A step of material 56 is disposed in the tunnel at the first end 40. Preferably, the step of material 56 is defined between the first inner diameter 50 and the second inner diameter 52. However, the subject invention may include the fitting 36 having one continuous inner diameter with the step of material 56 extending therefrom for displacement. In order to secure the fitting 36 to the wall 16, the step of material 56, at least in part, is radially and longitudinally displaced relative to the axis 48 into contact with the wall 16. It is to be appreciated by those skilled in the art that the displacement of the material 56 may be in an arch having a radial and a longitudinal component.

Figure 5:
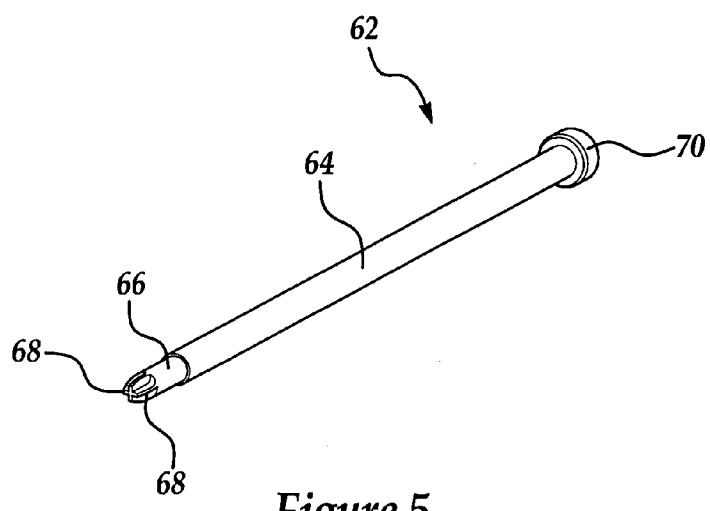
FIG. 5 is a perspective view of a tool used for securing a fitting to the tank.

A tool 62, shown in FIG. 5, is inserted into the fitting 36 to displace the material 56 radially and longitudinally. The tool 62 includes a shaft portion 64 and a tip portion 66. The shaft portion 64 preferably has a diameter that is the same as the second inner diameter 52; however, it could be smaller. The tip portion 66 includes prongs 68 having a diameter larger than first inner diameter 50 to displace the step of material 56. The tip portion 66 may include two or more prongs 68, but it is preferred that the tip portion 66 has four prongs 68. The tool 62 is illustrated having an end 70 that may be incorporated into a machine for automatically securing the fitting 36 to the tank 14 or that could attached to any other device for supplying a force sufficient to attach the fitting 36 to the tank 14.

Figure 6:
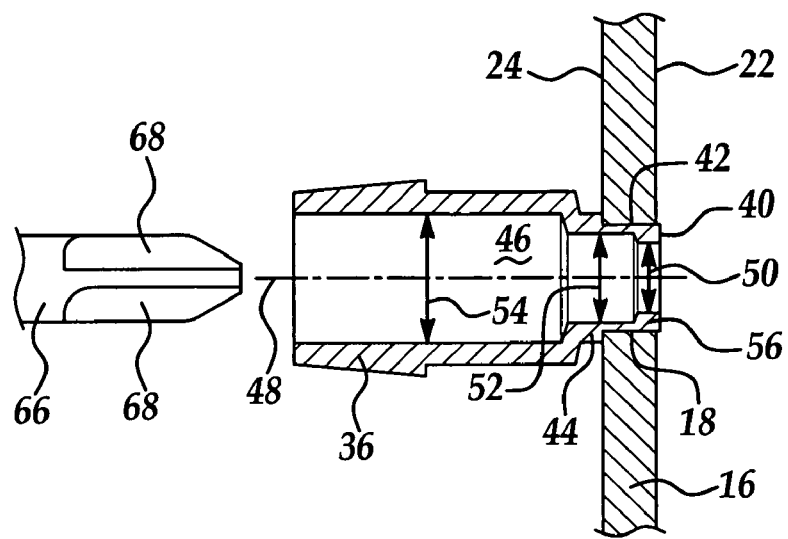
FIG. 6 a cross-sectional view of the tank having the fitting inserted therein and the tool aligned for securing the fitting to the tank.

Referring to FIG. 6, the tool 62 is illustrated being aligned with the fitting 36 for inserting from outside the tank 14. The step of material 56 preferably has a thickness of less than a thickness of the wall 16. The thickness of the material 56 allows the material 56 to extend longitudinally and radially beyond the inner surface 22 of the wall 16, while remaining connected with the fitting 36. The displacement beyond and into the wall 16 prevents rotational movement. Preventing rotational movement is important when connecting the tube to the fitting 36, especially if the tube is connected with a rotational motion. Said another way, when the tool 62 displaces the step of material 56, the material 56 extends beyond the first end 40 and beyond the outer perimeter 42. It is to be appreciated by those skilled in the art that the amount of displacement may be slight so long as the fitting 36 is secured therein. The figures may exaggerate the amount of displacement to illustrate the subject invention.

Figure 7:
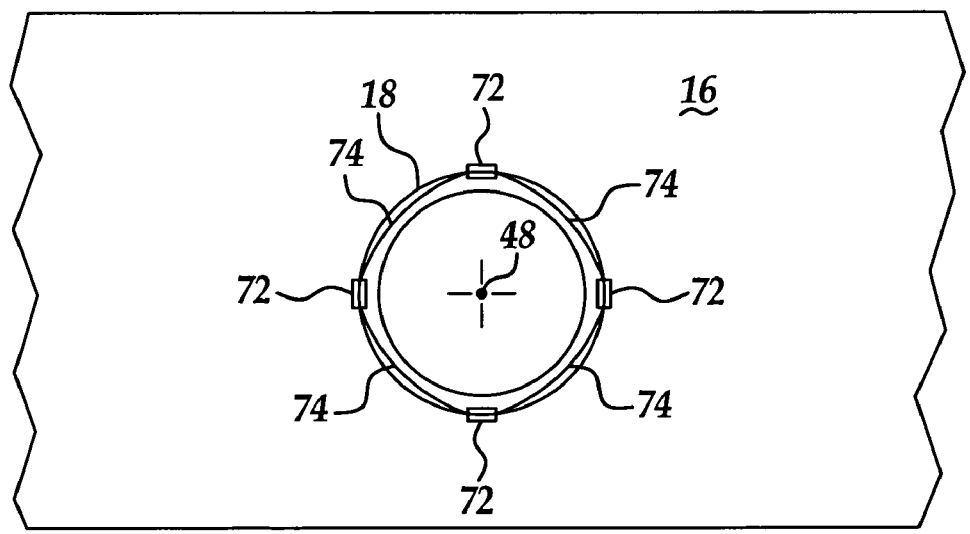
FIG. 7 is a close-up side view of the tank and the fitting after the tool has secured the fitting to the tank.

In order to secure the fitting 36 to the wall 16, it is within the scope of the invention to displace the entire step of material 56. However, it is preferred that a plurality of discrete and separate points 72 of material 56 be radially and longitudinally displaced into contact with the wall 16. FIG. 7 illustrates the plurality of discrete and separate points 72 having been displaced. Displacement of the points 72 distorts the first end 40 and defines gaps 74 between the outer perimeter 42 of the first end 40 and the aperture 18. These gaps 74 facilitate further securing of the fitting 36 to the assembly by allowing a brazing material 58 to flow into the gaps 74.

Figure 8:
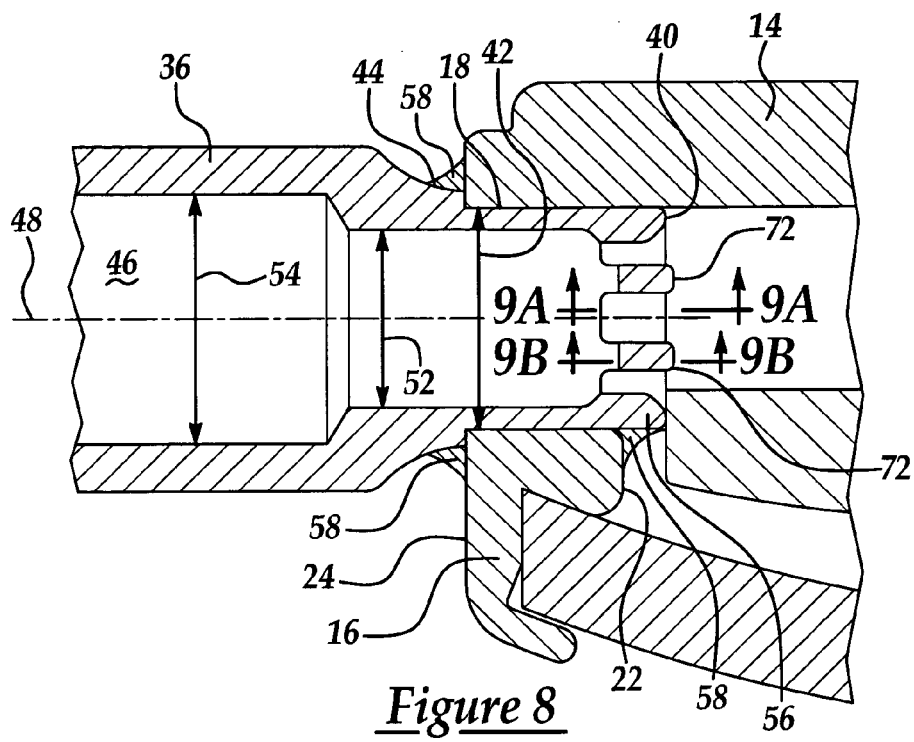
FIG. 8 is a cross-sectional view of the tank and the fitting after the fitting has been secured to the tank with the tool.

With reference to FIG. 8, a cross-sectional view of the tank 14 having the fitting 36 secured thereto is illustrated. Two points 72 are illustrated as being displaced beyond the first end 40 and into contact with the wall 16. In addition to the brazing material 58 in the gaps 74, additional brazing material 58 may be disposed about the aperture 18 on each of the inner and the outer surfaces 22, 24 for securing the fitting 36 thereto. Those skilled in the art shall recognize that a ring of brazing material 60 may be positioned about the first end 40 prior to insertion into the aperture 18. The ring of brazing material 60 will flow both in the gaps 74 and at the inner and the outer surfaces 22, 24 of the wall 16. This combination of the brazing material 58 further secures the fitting 36 to the tank 14.

Figure 9A:
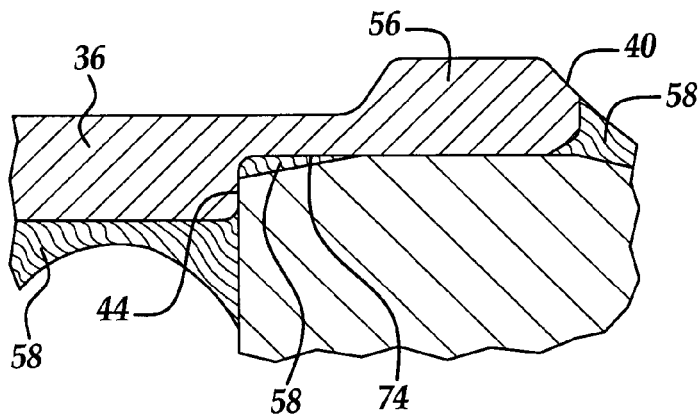
FIGS. 9A and 9B are close-up cross-sectional views of the fitting having been secured to the tank along lines 9A—9A and 9B—9B illustrated in FIG. 8.
Figure 9B:
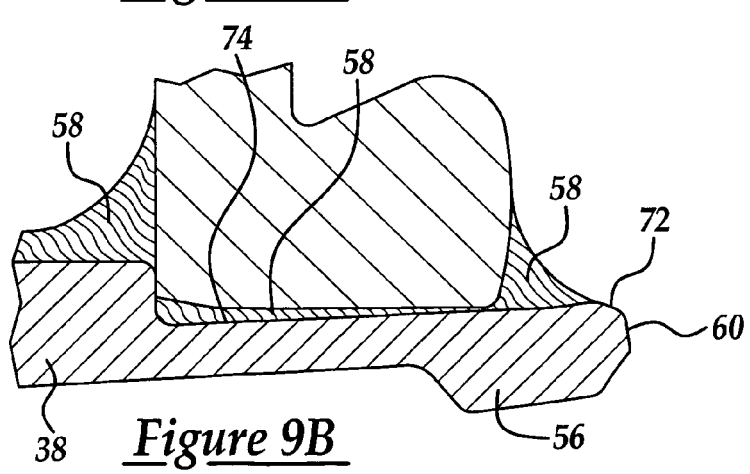

Referring to FIGS. 9A and 9B, a close-up cross-sectional view of the aperture 18 in the wall 16 and the fitting 36 is illustrated. FIG. 9A is a part of the step of material 56 that has not been displaced and is taken along line 9A—9A in FIG. 8. FIG. 9B is a part of the step of material 56 that has been displaced and is taken along line 9B—9B in FIG. 8. The points 72 shown in FIG. 8 have been both radially and longitudinally displaced into contact with the wall 16. The distorting of the first end 40 results in the gaps 74 and the brazing material 58 flows therein. Further, the brazing material 58 is illustrated about the outer surface 24 of the tank 14 and the inner surface 22 within the tank 14.

In operation, the subject invention provides a method of securing the fitting 36 into the aperture 18. The method includes the steps of disposing the first end 40 of the fitting 36 into the aperture 18 such that the flange 44 abuts the outer surface 24, shown best in FIG. 6. The flange 44 ensures that the step will be located within the aperture 18. The tool 62 is inserted within the fitting 36 from a direction outside of the tank 14. Insertion of the tool 62 radially and longitudinally displaces at least a part of the step of material 56 relative to the axis 48 into contact with the wall 16, as best shown in FIG. 9B.

Next, the brazing material 58 is flowed into the gaps 74 to secure the fitting 36 to the aperture 18. The flowing of the brazing material 58 may be accomplished in an oven, via induction heating, or by other methods that are well known to those skilled in the art. Additionally, the ring of material 60 may be positioned about the first end 40 prior to inserting the tool 62. In this way, the brazing material 58 will also be present on each of the inner and the outer surfaces 22, 24 of the wall 16.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A heat exchanger assembly comprising:
    a tank having a wall having an inner surface and an outer surface and defining an aperture therebetween;
    a fitting having a first end and a flange spaced apart from the first end by a section that extends through the aperture, said flange abutting the outer surface of the wall, and said first end being disposed within the tank adjacent the inner surface of the wall;
    said fitting having an internal tunnel extending along an axis thereto from said first end; and
    a step of material disposed in said tunnel at said first end and axially spaced apart from the flange, whereby said internal tunnel has a first diameter at said first end adjacent the step of material and a second diameter adjacent the flange greater than the first diameter;
    at least a portion of said step of material being radially and longitudinally displaced relative to said axis into contact with said wall to prevent rotational movement of said fitting in said aperture.

2. A heat exchanger assembly as set forth in claim 1 wherein said step of material further comprises a plurality of discrete and separate points of material radially and longitudinally displaced into contact with said wall.

3. A heat exchanger assembly as set forth in claim 2 wherein said points further define gaps between said outer perimeter of said first end and said aperture.

4. A heat exchanger assembly as set forth in claim 3 further comprising a brazing material disposed in said gaps for securing said fitting therein.

5. A heat exchanger assembly as set forth in claim 1 wherein said step of material is further defined as having a thickness of less than a thickness of said wall.

6. A heat exchanger assembly as set forth in claim 1 further comprising brazing material disposed about said aperture on each of said inner and said outer surfaces for securing said fitting thereto.

7. A method of securing a fitting into a tank of a heat exchanger assembly having a wall defining an aperture therein, said method comprising the steps of:
    providing a fitting comprising a first end and a flange spaced apart from the first end by a section, said fitting further comprising an internal tunnel extending along an axis from the first end and a step of material disposed in the tunnel at the first end and axially spaced from the flange, said internal tunnel having a first diameter at said first end adjacent the step of material and a second diameter adjacent the flange greater than the first diameter;
    disposing the first end of the fitting into the aperture such that the flange abuts an outer surface of the tank the section extends through the aperture, and the first end is disposed within the tank adjacent an inner surface thereof;
    inserting a tool within the fitting from a direction outside of the tank; and radially and longitudinally displacing at least a part of the step of material relative to the axis into contact with the wall in response to insertion of the tool to prevent rotational movement of the fitting in the aperture.

8. A method as set forth in claim 7 wherein the step of displacing the step of material is further defined as displacing a plurality of discrete and separate points of material spaced about the internal tunnel.

9. A method as set forth in claim 8 further comprising the step of distorting the first end to define gaps between the outer perimeter and the aperture as a result of displacing the points into contact with the wall.

10. A method as set forth in claim 9 further comprising the step of flowing a brazing material into the gaps to secure the fitting to the aperture.

11. A tank comprising:
    a wall having an inner surface and an outer surface and defining an aperture therebetween;
    a fitting having a first end and a flange spaced apart from the first end by a section that extends through the aperture, said flange abutting the outer surface of the wall, and
    said first end being disposed within the tank adjacent the inner surface of the wall;
    said fitting having an internal tunnel extending along an axis thereto from said first end; and
    a step of material disposed in said tunnel at said first end and axially spaced apart from the flange, whereby said internal tunnel has a first diameter at said first end adjacent the step of material and a second diameter adjacent the flange greater than the first diameter;
    at least a portion of said step of material being being at least in part radially and longitudinally displaced relative to said axis into contact with said wall to prevent rotational movement of said fitting in said aperture.

12. A tank as set forth in claim 11 wherein said step of material further comprises a plurality of discrete and separate points of material radially and longitudinally displaced into contact with said wall.

13. A tank as set forth in claim 12 wherein said points further define gaps between said outer perimeter of said first end and said aperture.

14. A tank as set forth in claim 13 further comprising a brazing material disposed in said gaps for securing said fitting therein.

15. A tank as set forth in claim 11 wherein said fitting further comprises a flange extending about said outer perimeter for abutting said outer surface of said wall to locate said step within said aperture.

* * * * *